United States Patent [19]
Dao et al.

[11] Patent Number: 5,824,601
[45] Date of Patent: Oct. 20, 1998

[54] CARBOXYLIC ACID ETCHING SOLUTION AND METHOD

[75] Inventors: Patrick P. H. Dao, Chandler; Paul William Dryer, Gilbert; Ping-Chang Lue, Scottsdale; Michael J. Davison, Mesa; Terry Andrew Willett; Margaret Leslie Kniffin, both of Tempe; Rita Prasad Subrahmanyan, Mesa, all of Ariz.

[73] Assignee: Motorola, Inc., Schaumburg, Ill.

[21] Appl. No.: 885,265

[22] Filed: Jun. 30, 1997

[51] Int. Cl.$^6$ .............................................. B44C 1/22
[52] U.S. Cl. ........................ 438/713; 216/104; 216/109; 216/103; 252/79.3; 438/714; 438/911; 438/733
[58] Field of Search ..................... 216/103, 104, 216/102, 108, 109; 438/713, 733, 714, 911; 252/79.3

[56] References Cited

U.S. PATENT DOCUMENTS 2,970,044  1/1961  Ostapkouich ................................. 41/42
4,395,304  7/1983  Kern ........................................ 156/657

OTHER PUBLICATIONS

J. Micromech, Microegn.7 (1997) R1–R13. Printed in UK; Review Article, "Silicon Dioxide Sacrificial Layer etching in Surface Micromaching"; J. Buhler, F–P Steiner and H. Galtes; pp. R1–R13.

*Primary Examiner*—R. Bruce Breneman
*Assistant Examiner*—Anita Alanko
*Attorney, Agent, or Firm*—Rennie William Dover

[57] ABSTRACT

A sacrificial oxide etching solution of carboxylic acid and HF having a high etch selectivity for silicon oxide relative to polysilicon, metal, and nitride. The solution is useful in the fabrication of microstructures having integrated electronics on the same chip. A carboxylic acid anhydride can be added to this solution to substantially remove all free water so that the etch selectivity to metal is improved. One specific solution is formed by mixing acetic acid, acetic anhydride, and aqueous HF.

41 Claims, No Drawings

CARBOXYLIC ACID ETCHING SOLUTION AND METHOD

BACKGROUND OF THE INVENTION

The present invention relates, in general, to an etching solution and, more particularly, to an etching solution of hydrogen fluoride and carboxylic acid, for example, for use in etching an oxide in the manufacture of semiconductor devices.

The deposition and etching of dielectric and metal layers to form three-dimensional mechanical structures such as microsensors and microactuators, which are commonly made of polysilicon, is generally known as surface micromachining. Silicon dioxide sacrificial layer etching is an important surface micromachining method used in the fabrication of such structures.

The sacrificial oxide is typically provided in a polysilicon structure that also may include aluminum metallization or silicon nitride (e.g. used for passivation), which provide other aspects desired in the final structure. When etching the sacrificial oxide, it is desirable to minimize the extent to which the polysilicon, metal, and nitride materials, which form portions of the final desired structure, are etched by the sacrificial oxide etching solution.

The extent to which any particular etching solution etches non-oxide materials is characterized by the etch selectivity of the solution, with a high etch selectivity for oxide relative to, for example, metal being desirable. One prior etching solution is a so-called buffered oxide etch (BOE) solution containing hydrogen fluoride buffered by ammonium fluoride. However, the BOE solution exhibits poor etch selectivity in that this solution severely attacks or etches exposed metal, polysilicon, and/or nitride surfaces during the sacrificial oxide etch. In particular, aluminum metallization is often almost completely eroded before the sacrificial oxide is completely removed.

A common use for micromachining as described above is in the formation of sensors. In particular, it is becoming desirable to form integrated electronics on the same semiconductor chip used to form a sensor. However, when forming a sensor, which requires the etching of a sacrificial oxide, and integrated electronics on the same chip, it is important that the metallization and passivation features of the chip not be detrimentally eroded by the sacrificial oxide etching solution.

Accordingly, it is desirable to provide a solution for etching a sacrificial oxide having a high etch selectivity for silicon oxide relative to metal, polysilicon, and nitride, and suitable for the fabrication of microstructures and electronics on the same semiconductor chip.

DETAILED DESCRIPTION

The present invention generally provides an etching solution that is a mixture of a carboxylic acid and hydrogen fluoride (HF). The solution is useful in the etching of oxides in general and more specifically for the etching of silicon oxides as, for example, those used in sacrificial oxide layers in the fabrication of microstructures such as sensors and micromachines. An important advantage of the etching solution of the present invention is that it has a high etch selectivity for silicon oxide relative to other materials, including metals, nitrides, and polysilicon, that form the structural components of typical microstructures. As a result of this etch selectivity, the etching solution of the present invention can remove sacrificial oxides with only minor erosion of these other materials. This leads to improved manufacturability in the fabrication of a large variety of microstructures.

The etching solution is described further below in one embodiment with an example of its use in the removal of doped silicon oxide that is used as a sacrificial oxide layer in the formation of a surface-micromachined structure. However, one of ordinary skill will recognize that the etching solution is also generally applicable to the removal of other types of oxides that may be used in micromechanical structure and microelectronics fabrication, especially where metals, nitrides, and/or polysilicon materials will be exposed to the etching solution during oxide removal. Typically, the sacrificial oxide is in contact with portions of the microstructure (which are, for example, formed of polysilicon) prior to sacrificial oxide etching. The etching of sacrificial oxides in general is described in "Silicon dioxide sacrificial layer etching in surface micromachining," by J. Buhler et al., J. Micromech. Microeng. 7 (1997), pp. R1–R13, which is hereby incorporated by reference in full.

The high etch selectivity of the present etching solution permits the removal of the sacrificial oxide without significant degradation of the exposed metal (for example, in a metal layer), nitride, or polysilicon surfaces. One important result of this is that transistors (for example, complementary metal oxide semiconductor (CMOS) devices) can be integrated in a practical process flow onto the same semiconductor chip used to form the microstructure.

One type of doped silicon oxide used as a sacrificial oxide is phosphorous-doped silicon oxide (PSG). A prior solution used to etch PSG is buffered HF (BHF). However, BHF vigorously attacks exposed metal surfaces such as aluminum such that it is not practical for use as a sacrificial oxide etchant. However, the use of a carboxylic acid as a solvent (or diluent) for HF has been found to overcome this problem of severe metal erosion. It is believed that the carboxylic acid component of the etching solution reduces aluminum erosion because the dissolution rate of aluminum is relatively slow in carboxylic acid. Experimental results have confirmed that an etching solution of HF and carboxylic acid exhibits greatly reduced erosion of aluminum while also exhibiting minimal erosion of polysilicon and silicon nitride.

The carboxylic acid used can be selected generally as any acid having one or more carboxyl groups and more specifically including, for example, oxalic acid, formic acid, lactic acid, tartaric acid, malic acid, succinic acid, citric acid, and acetic acid. It has been found that acetic acid is particularly useful for etching of PSG.

The mixing ratio of carboxylic acid to HF is not critical, but it has been found that a preferred range when using an aqueous HF solution (for example, a 49% by weight solution of HF in water) is in the ratio of about 4:1 to 8:1 parts by volume carboxylic acid to aqueous hydrofluoric acid. This ratio is particularly useful when using acetic acid as the carboxylic acid. Even more preferred is a ratio of about 6:1, especially when using acetic acid and a 49% HF solution. For example, in a mixture of acetic acid and 49% HF solution in a 6:1 ratio by volume, the concentration by weight of each component in the mixture is about 83% acetic acid, 8% HF, and 9% $H_2O$. Typically, the HF in water solution is commercially purchased in pre-mixed (or pre-dissolved) form and then combined with the carboxylic acid.

It is preferred that the carboxylic acid used to form the mixture be water-free so that the water content of the final etching solution is reduced. Accordingly, it is preferred that the carboxylic acid used for mixing be anhydrous (for example, glacial acetic acid).

As will be discussed below, an alternative approach to form the etching solution is to mix gaseous HF directly into a carboxylic acid. When using this alternative approach, in general, the mixing ratio is selected to provide an HF concentration by weight in the final solution similar to that which is achieved when mixing the aqueous HF solutions as described above. For example, gaseous HF can be mixed with anhydrous (glacial) acetic acid to provide an HF concentration by weight in the final solution of about 8%.

When using an etching solution of carboxylic acid and HF as described above, in general, the etch selectivity for silicon oxide relative to aluminum is greater than about 500, the etch selectivity for silicon oxide relative to polysilicon is greater than about 150,000, and the etch selectivity for silicon oxide relative to silicon nitride is greater than about 2,000. The etch selectivities given here are determined by the ratio of the etching rate of the silicon oxide divided by the etching rate of the other material. These etch selectivities are achieved, for example, where the silicon oxide is PSG containing greater than about 4% by weight of phosphorous or another dopant. In particular, one preferred PSG layer can be formed using plasma-enhanced tetraethylorthosilicate (PETEOS) with doping introduced by tetramethylphosphite (TMPi). It should be noted that these etch selectivities generally correspond to a doped sacrificial oxide and that the selectivities decrease as the level of oxide doping decreases due to a lower oxide etch rate.

The high etch selectivities above are related to the low metal, nitride, and polysilicon etch rates exhibited by the etching solution. For example, a conventional aluminum/silicon alloy (containing about 1% silicon by weight) is etched in general at a rate of less than about 10 angstroms/minute, and in some cases at less than about 2 angstroms/minute. Also, in general, polysilicon is etched at a rate of less than about 1 angstrom/minute.

It should be noted that the level of doping of the silicon oxide and the densification affect the etch rates of the oxide. In general, higher doping levels result in a higher etch rate for silicon oxide. Also, more densified silicon oxide exhibits a slower etch rate due to the tighter atomic network resulting from the anneal processing used for densification.

It has been discovered that the removal of substantially all free water (i.e. $H_2O$) from the carboxylic acid/HF solution of the present invention results in even more dramatic improvements in etch selectivity, especially with respect to aluminum. In general, the etch selectivity for this substantially water-free etching solution for silicon oxide relative to metal (for example, aluminum) is greater than about 500 and more preferably greater than about 1,700. These etch selectivities are achieved, for example, where the silicon oxide is PSG containing greater than about 4% by weight of phosphorous or another dopant, and similarly as described above for the prior embodiment, the etch selectivities generally decrease as the oxide doping level decreases.

Also, the etch selectivity generally increases as the free water content of the etching solution decreases. The etch selectivities with respect to polysilicon and nitride are also high in this free-water embodiment (see the working example below).

Thus, it is preferred in this alternative embodiment that, when forming the etching solution described above, free water substantially not be present in the final mixture. Although the absence of free water is most preferred, even some reduction in the amount of free water in the final solution results in improved etch selectivities.

Free water removal can be accomplished in one approach by mixing a carboxylic acid, HF, and a carboxylic acid anhydride. The anhydride chemically reacts with any water in the HF (or in the carboxylic acid) in a well-known chemical reaction such that free water is removed from the solution. Accordingly, the anhydride proportion to be mixed with the other components is selected so that sufficient anhydride is present to react with free water in the solution (for example, that is present from the use of a conventional 49% by weight HF acid solution). The product of the reaction of the carboxylic acid anhydride and water is the corresponding carboxylic acid. A preferred carboxylic acid is acetic acid, and a preferred anhydride is acetic anhydride. However, the carboxylic acids described in general above and their anhydrides are generally useful in this embodiment.

The proportion of anhydride added is not critical, and the anhydride can even be added somewhat in excess of the amount needed to remove free water. A preferred mixture can be made by mixing carboxylic acid with anhydrous carboxylic acid and HF (for example, 49% by weight HF in water) in the ratio of about 3:1:1 to 3:5:1 parts by volume carboxylic acid to anhydrous carboxylic acid to hydrofluoric acid solution, and even more preferably in the ratio of about 3:3:1. For example, a solution formed by mixing acetic acid, acetic anhydride, and 49% HF in the volumetric ratio of about 3:3:1 results in a final solution (after reaction of the acetic anhydride with the free water in the 49% HF solution) with the following weight percentage components: about 91% acetic acid, about 8% HF, and about 1% $H_2O$.

Mixing carboxylic acid anhydride with an aqueous HF solution causes an exothermic reaction. Significant heat is generated from this reaction, so a preferred approach for forming the etching solution of this embodiment is to first mix carboxylic acid and carboxylic acid anhydride, and then to slowly add aqueous HF (for example, by a drip feed line) to provide a means for controlling heat generation. It is preferred that the solution be maintained at a temperature below about 55 degrees Celsius (°C.), and more preferably below about 25° C., during mixing. A conventional means of removing the heat generated during this mixing should be provided to keep the temperature of the chemical components below their boiling points in solution. This means can be, for example, cooling coils placed in the solution being mixed.

As mentioned above, an alternative approach to achieve a water-free solution is to dissolve gaseous HF directly in anhydrous carboxylic acid. Because neither the HF nor the acid contains free water, the use of an anhydride in this alternative approach is not necessary. The proportions generally used for mixing are as described earlier.

The temperature required for use of the etching solutions according to the present invention, both the carboxylic acid/HF solution earlier and the water-free embodiment just described, are not critical. In general, during etching it is preferred to use a cooler temperature of below about 25° C. (for example, of about 15°–25° C.). An advantage of such a cooler temperature is a reduction in evaporative loss from the etching solution. Also, it is preferable that the etching solution is in the liquid phase during etching.

Further, it is preferred that the etching solution and device having a sacrificial oxide to be etched be placed in a sealed environment substantially free of water. For example, a sealed container or etching bath with a closed lid and having been purged with an inert gas such as nitrogen can be used. It has been discovered that water absorption from the atmosphere above the carboxylic acid/HF etching solution undesirably increases the metal etching rate.

In yet another embodiment of the present invention the etching solution is formed by mixing carboxylic acid anhydride and HF, but without any acetic acid. The HF may be either aqueous or gaseous, and the proportion of HF in the final solution is similar to that of the solutions described above. An advantage of gaseous HF is that the final solution will be substantially free of water.

Working examples for the use of acetic acid/HF solutions are provided below for only the purpose of further illustration and are not intended to limit the scope of applicability of the present invention. As was discussed above, the present invention is applicable to and useful for a wide variety of carboxylic acid/HF solutions and microstructures.

Example 1

A mixture of 4:1 parts by volume of glacial acetic acid to 49% by weight HF in water achieved a lateral etch rate of about 1 micron per minute for a sacrificial oxide of 4.5% by weight PSG that was densified by rapid thermal annealing. The sacrificial oxide was removed from an accelerometer microstructure, and etching was performed for about 50 minutes at room temperature.

Example 2

A mixture of glacial acetic acid and 49% by weight HF in water was prepared in the ratio of 6:1 parts by volume (acetic acid:HF) and used to etch a PSG blanket film (formed by PETEOS) having a 6.5% by weight concentration of phosphorous dopant (introduced by TMPi). The etching was performed at about 18° C. and the blanket film etch rates measured were as follows:

| Material | Etch Rate (angstroms/minute) |
| --- | --- |
| polysilicon | 0.15 |
| silicon nitride | 9.5 |
| PSG | 23,000 |
| aluminum containing 1% silicon by weight | 45 |

Example 3

A mixture of glacial acetic acid, acetic anhydride, and 49% by weight HF in water was prepared in the ratio of 3:3:1 parts by volume (acetic acid:acetic anhydride:HF) and used to etch a PSG blanket film (formed by PETEOS) having a 6.5% by weight concentration of phosphorous dopant (introduced from TMPi). The etching was performed at about 18° C. and the blanket film etch rates measured were as follows:

| MATERIAL | ETCH RATE (angstroms/minute) |
| --- | --- |
| polysilicon | 0.20 |
| silicon nitride | 6.0 |
| PSG | 17,000 |
| aluminum containing 1% silicon by weight | less than 10 |

By now, it should be appreciated that there has been provided a novel etching solution of carboxylic acid and HF that is useful for etching sacrificial oxides during microstructure fabrication. The solution's etch selectivity for silicon oxide relative to polysilicon, nitride, and metal is significantly higher than for prior sacrificial oxide etching solutions and now permits the practical integration of micromachined structures on the same chip as integrated circuit (IC) electronics.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An etching solution, comprising:
    a carboxylic acid, wherein said carboxylic acid comprises at least one member selected from the group consisting of oxalic acid, lactic acid, tartaric acid, malic acid, succinic acid, and citric acid; and
    hydrogen fluoride.

2. The etching solution of claim 1 wherein said etching solution is characterized by an etching rate of an aluminum alloy of less than about 10 angstroms/minute, wherein said aluminum alloy comprises silicon in a proportion of about 1% by weight.

3. The etching solution of claim 2 wherein said etching rate of said aluminum alloy is less than about 2 angstroms/minute.

4. The etching solution of claim 1 wherein said etching solution is characterized by an etching rate of polysilicon of less than about 1 angstrom/minute.

5. The etching solution of claim 1 wherein said etching solution has an etch selectivity for silicon oxide relative to aluminum of greater than about 500.

6. The etching solution of claim 5 wherein said silicon oxide is doped to have a concentration of a dopant of greater than about 4% by weight.

7. The etching solution of claim 5 wherein said silicon oxide is a phosphorous-doped silicon oxide containing greater than about 4% by weight of phosphorous.

8. The etching solution of claim 1 wherein said etching solution has an etch selectivity for silicon oxide relative to polysilicon of greater than about 150,000.

9. The etching solution of claim 8 wherein said silicon oxide is doped to have a concentration of a dopant of greater than about 4% by weight.

10. The etching solution of claim 1 wherein said etching solution has an etch selectivity for silicon oxide relative to silicon nitride of greater than about 2,000.

11. The etching solution of claim 10 wherein said silicon oxide is doped to have a concentration of a dopant of greater than about 4% by weight.

12. The etching solution of claim 1 wherein said etching solution is made by mixing said carboxylic acid with an aqueous hydrofluoric acid, comprising said hydrogen fluoride, in a ratio of about 4:1 to 8:1 parts by volume carboxylic acid to aqueous hydrofluoric acid.

13. The etching solution of claim 12 wherein said aqueous hydrofluoric acid comprises about 49% hydrogen fluoride by weight.

14. The etching solution of claim 12 wherein said ratio is about 6:1.

15. The etching solution of claim 12 wherein said carboxylic acid is acetic acid.

16. An etching solution, comprising
    a carboxylic acid; and
    hydrogen fluoride, wherein said etching solution is formed by mixing said carboxylic acid, said hydrogen fluoride, and a carboxylic anhydride.

17. The etching solution of claim 16 wherein said carboxylic acid anhydride is acetic anhydride and said carboxylic acid is acetic acid.

18. The etching solution of claim 16 wherein said etching solution has an etch selectivity for silicon oxide relative to aluminum of greater than about 500.

19. The etching solution of claim 18 wherein said silicon oxide is doped to have a concentration of a dopant of greater than about 4% by weight.

20. The etching solution of claim 16 wherein said etching solution has an etch selectivity for silicon oxide relative to aluminum of greater than about 1,700.

21. The etching solution of claim 20 wherein said silicon oxide is doped to have a concentration of a dopant of greater than about 4% by weight.

22. The etching solution of claim 16 wherein said carboxylic acid anhydride is added in an amount corresponding to the removal of substantially all free water from said etching solution.

23. The etching solution of claim 16 wherein said etching solution is made by mixing said carboxylic acid with said carboxylic acid anhydride and a hydrofluoric acid, comprising said hydrogen fluoride, in a ratio of about 3:1:1 to 3:5:1 parts by volume carboxylic acid to carboxylic acid anhydride to hydrofluoric acid.

24. The etching solution of claim 23 wherein said ratio is about 3:3:1.

25. The etching solution of claim 23 wherein:

said carboxylic acid is acetic acid; and said carboxylic acid anhydride is acetic anhydride.

26. An etching solution for removing a sacrificial oxide comprising a carboxylic acid anhydride and hydrogen fluoride, wherein said etching solution is substantially free of water.

27. The etching solution of claim 26 wherein said etching solution consists essentially of carboxylic acid anhydride and hydrogen fluoride.

28. A method for manufacturing a semiconductor device using an oxide, said method comprising the step of etching said oxide using an etching solution comprising carboxylic acid and hydrogen fluoride, wherein:

said semiconductor device comprises a metal layer at least partially exposed to said etching solution during said step of etching;

said sacrificial oxide is silicon oxide; and said etching solution has an etch selectivity for said silicon oxide relative to said metal layer of greater than about 500.

29. The method for manufacturing said semiconductor device of claim 28 wherein said silicon oxide is phosphorous-doped and contains greater than about 4% by weight of phosphorous.

30. The method for manufacturing said semiconductor device of claim 28 wherein said metal layer comprises aluminum.

31. A method for manufacturing said semiconductor device using an oxide, said method comprising the step of etching said oxide using an etching solution comprising carboxylic acid and hydrogen fluoride, wherein said etching solution is formed by mixing said hydrogen fluoride in a gaseous form with said carboxylic acid.

32. The method for manufacturing said semiconductor device of claim 31 wherein said carboxylic acid is glacial acetic acid.

33. A method for manufacturing said semiconductor device using an oxide, said method comprising the step of etching said oxide using an etching solution comprising carboxylic acid and hydrogen fluoride, wherein said etching solution is formed by mixing said carboxylic acid, said hydrogen fluoride, and a carboxylic acid anhydride.

34. The method for manufacturing said semiconductor device of claim 33 wherein said step of etching is performed at a temperature of less than about 25° C.

35. The method for manufacturing said semiconductor device of claim 34 wherein said etching solution and said semiconductor device are placed within a substantially water-free container during said step of etching.

36. The method for manufacturing said semiconductor device of claim 35 wherein said container has been purged with an inert gas.

37. The method for manufacturing said semiconductor device of claim 36 wherein said inert gas is nitrogen.

38. The method for manufacturing said semiconductor device of claim 33 wherein said carboxylic acid is acetic acid and said carboxylic acid anhydride is acetic anhydride.

39. The method for manufacturing said semiconductor device of claim 38 wherein said acetic anhydride is mixed in an amount corresponding to the removal of substantially all $H_2O$ from said etching solution.

40. A method for manufacturing said semiconductor device using an oxide, said method comprising the step of etching said oxide using an etching solution comprising carboxylic acid and hydrogen fluoride, wherein said semiconductor device is a micromachined device and said sacrificial oxide is in contact with a portion of a polysilicon microstructure in said device.

41. A method for manufacturing a semiconductor device using a sacrificial oxide, said method comprising the step of:

etching said sacrificial oxide using an etching solution comprising acetic acid and hydrogen fluoride; and wherein said semiconductor device comprises a metal layer at least partially exposed to said etching solution during said step of etching; said sacrificial oxide is a silicon oxide; and said etching solution is formed by mixing acetic acid, hydrogen fluoride, and acetic anhydride.

* * * * *